United States Patent
Kocon et al.

(10) Patent No.: US 10,741,684 B2
(45) Date of Patent: Aug. 11, 2020

(54) INTEGRATED CHANNEL DIODE

(71) Applicant: Texas Instruments Incorporated, Dallas, TX (US)

(72) Inventors: Christopher Boguslaw Kocon, Mountain Top, PA (US); Simon John Molloy, Allentown, PA (US); John Manning Savidge Neilson, Norristown, PA (US); Hideaki Kawahara, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 557 days.

(21) Appl. No.: 15/283,523

(22) Filed: Oct. 3, 2016

(65) Prior Publication Data

US 2017/0025525 A1    Jan. 26, 2017

Related U.S. Application Data

(63) Continuation of application No. 14/299,040, filed on Jun. 9, 2014, now Pat. No. 9,484,450.

(51) Int. Cl.
| | |
|---|---|
| *H01L 29/78* | (2006.01) |
| *H01L 29/40* | (2006.01) |
| *H01L 29/06* | (2006.01) |
| *H01L 29/10* | (2006.01) |
| *H01L 29/423* | (2006.01) |
| *H01L 29/417* | (2006.01) |
| *H01L 29/08* | (2006.01) |
| *H01L 29/66* | (2006.01) |

(52) U.S. Cl.
CPC ........ *H01L 29/7804* (2013.01); *H01L 29/063* (2013.01); *H01L 29/0696* (2013.01); *H01L 29/0865* (2013.01); *H01L 29/0878* (2013.01); *H01L 29/1095* (2013.01); *H01L 29/404* (2013.01); *H01L 29/407* (2013.01); *H01L 29/41741* (2013.01); *H01L 29/41766* (2013.01); *H01L 29/4238* (2013.01); *H01L 29/66727* (2013.01); *H01L 29/7811* (2013.01)

(58) Field of Classification Search
None
See application file for complete search history.

(56) References Cited

U.S. PATENT DOCUMENTS

| | | | |
|---|---|---|---|
| 8,704,295 B1 * | 4/2014 | Darwish | H01L 29/7806 257/330 |
| 9,881,995 B2 * | 1/2018 | Kocon | H01L 29/7804 |
| 2012/0211832 A1 | 8/2012 | Chu et al. | |

* cited by examiner

*Primary Examiner* — Robert K Carpenter
(74) *Attorney, Agent, or Firm* — Andrew R. Ralston; Charles A. Brill; Frank D. Cimino

(57) ABSTRACT

A semiconductor device includes a vertical drift region over a drain contact region, abutted on opposite sides by RESURF trenches. A split gate is disposed over the vertical drift region. A first portion of the split gate is a gate of an MOS transistor and is located over a body of the MOS transistor over a first side of the vertical drift region. A second portion of the split gate is a gate of a channel diode and is located over a body of the channel diode over a second, opposite, side of the vertical drift region. A source electrode is electrically coupled to a source region of the channel diode and a source region of the MOS transistor.

15 Claims, 13 Drawing Sheets

INTEGRATED CHANNEL DIODE

CROSS REFERENCE TO RELATED APPLICATIONS

Under 35 U.S.C. § 120, this continuation application claims priority to and benefits of U.S. patent application Ser. No. 14/299,040 (TI-73603), filed on Jun. 9, 2014, the entirety of which is hereby incorporated herein by reference.

FIELD

This disclosure relates to the field of semiconductor devices. More particularly, this disclosure relates to vertical metal oxide semiconductor transistors in semiconductor devices.

BACKGROUND

Semiconductor devices with metal oxide semiconductor (MOS) transistors having vertical drain drift regions may be useful for power switching applications. Low resistance operation of the vertical MOS transistors leads to significant charge in the drift regions. Dissipating the charge undesirably slows down switching times of the vertical MOS transistors, disadvantageously limiting operating frequencies of the power switching apparatus.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A semiconductor device includes a vertical drift region over a drain contact region. The drift region is abutted on a first side by a first RESURF trench and on a second, opposite, side by a second RESURF trench. The RESURF trenches have dielectric liners and field plates inside the dielectric liners. A split gate is disposed over the substrate over the vertical drift region. A first portion of the split gate is located proximate to the first RESURF trench over a first side of the vertical drift region and a second portion of the split gate is located proximate to the second RESURF trench over a second, opposite, side of the vertical drift region. A body of an MOS transistor of the semiconductor device is located proximate to the top surface of the substrate abutting the first RESURF trench and extending under the first portion of the split gate to the lightly doped drain extension. A body of a channel diode of the semiconductor device is located proximate to the top surface of the substrate abutting the second RESURF trench and extending under the second portion of the split gate to the lightly doped drain extension. A source electrode is electrically coupled to a source region of the channel diode and a source region of the MOS transistor.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

For the purposes of this description, the term "RESURF" will be understood to refer to a structure which reduces an electric field in an adjacent semiconductor region. A RESURF structure may be for example a dielectric trench adjacent to a drift region of an MOS transistor. RESURF structures are described in Appels, et. al., "Thin Layer High Voltage Devices" Philips J, Res. 35 1-13, 1980.

Examples disclosed herein will describe an n-channel MOS transistor and an n-channel diode. It will be recognized that corresponding examples with a p-channel MOS transistor and a p-channel diode may be obtained with appropriate changes in dopant polarities.

Figure 1:
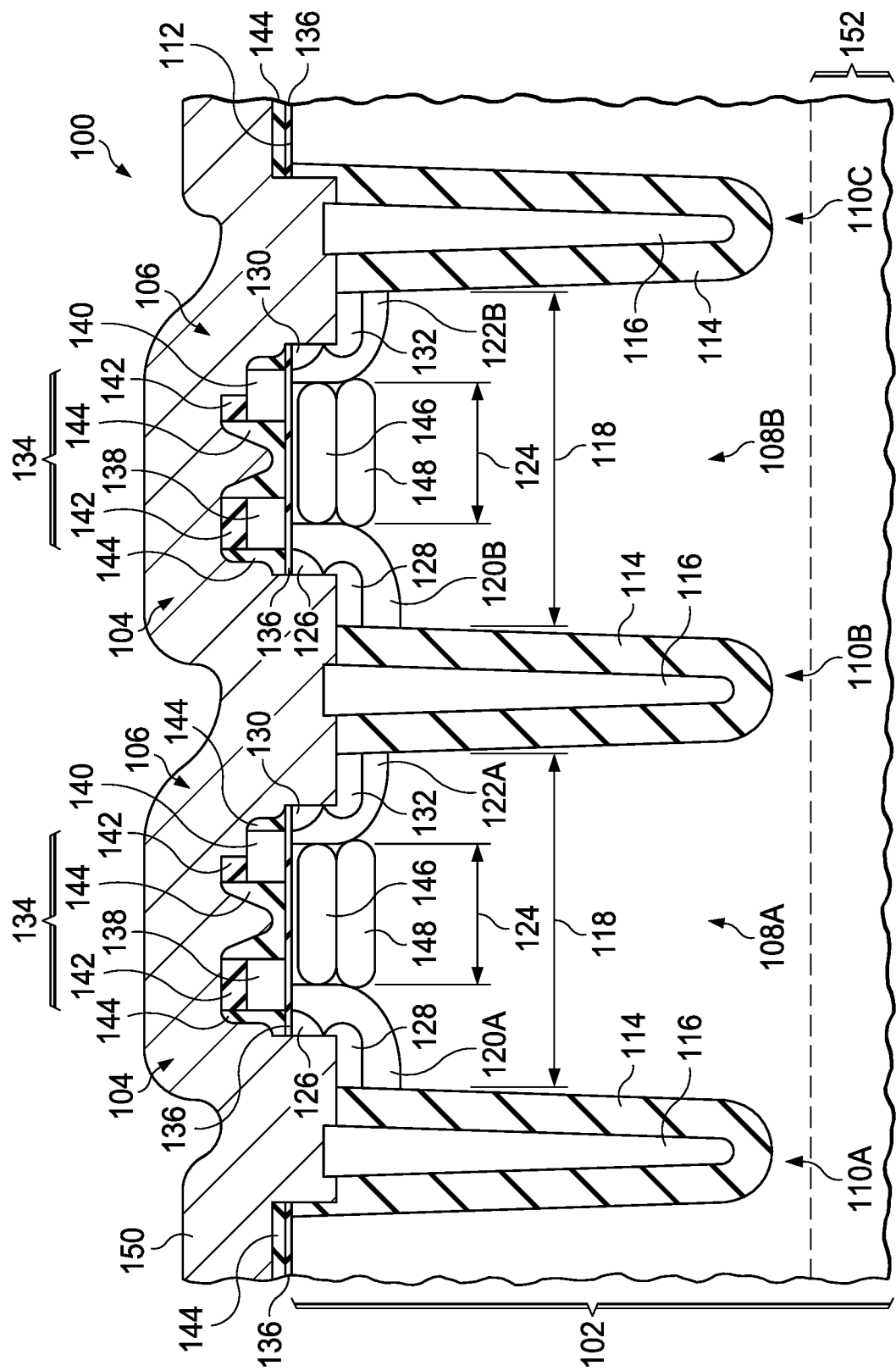
FIG. 1 is a cross section of an example semiconductor device containing an MOS transistor with a vertical drift region and an integrated channel diode.

FIG. 1 is a cross section of an example semiconductor device containing an MOS transistor with a vertical drift region and an integrated channel diode. The semiconductor device 100 is formed in and on a substrate 102 which includes semiconductor material such as single crystal silicon. The substrate 102 may be a bulk silicon wafer or an epitaxial layer of silicon-based semiconductor material on a silicon wafer. The MOS transistor 104 and the integrated channel diode 106 are both integrated into the semiconductor device 100.

The MOS transistor 104 includes an n-type vertical drift region 108 disposed in the substrate 102. A vertical thickness and average doping density of the vertical drift region 108 may depend on an operating voltage of the MOS transistor 104. For example, a MOS transistor 104 designed to operate at 30 volts may have a vertical drift region 108 that is 4 microns thick with an average doping density of $5 \times 10^{16}$ $cm^{-3}$ to $1\times10^{17}$ $cm^{-3}$. A MOS transistor 104 designed to operate at 100 volts may have a vertical drift region 108 that is 10 microns thick with an average doping density of $1\times10^{16}$ $cm^{-3}$ to $5\times10^{16}$ $cm^{-3}$. The vertical drift region 108 has one or more sections, for example a first section (108A), and a second section (108B) adjacent to the first section (108A), as depicted in FIG. 1. The sections (108A) and (108B) may possibly be separate so as to form a segmented vertical drift region 108, or may possibly be joined at one or more locations out of the plane of FIG. 1 so as to form a contiguous vertical drift region 108. The vertical drift region 108 may include additional sections, any subset of which may be separate or joined. Use of the terms first section (108A) and second section (108B) does not imply any particular configuration.

Each section of the vertical drift region (108A) and (108B) is abutted on at least two opposite sides by RESURF trenches 110. In the instant example, the first section of the vertical drift region (108A) is abutted on a first side by a first RESURF trench (110A) and abutted on a second, opposite, side by a second RESURF trench (110B), and the second section of the vertical drift region (108B) is abutted on a first side by the second RESURF trench (110B) and abutted on a second, opposite, side by a third RESURF trench (110C), as depicted in FIG. 1. The first RESURF trench (110A), the second RESURF trench (110B), and the third RESURF trench (110C) may possibly be separate so as to form a segmented RESURF trench 110, or any subset of the RESURF trenches (110A), (110B), and (110C) may possibly be joined at one or more locations out of the plane of FIG. 1 so as to form a contiguous RESURF trench 110. The semiconductor device 100 may include additional RESURF trenches 110 any subset of which may be separate or joined. Use of the terms first RESURF trench (110A), second RESURF trench (110B) and third RESURF trench (110C) does not imply any particular configuration.

A width 118 of each section of the vertical drift region (108A) and (108B) between adjacent RESURF trenches 110 is less than 5 microns and may be 1 microns to 3 microns. Each RESURF trench 110 includes a dielectric liner 114 contacting the substrate 102 and a field plate 116 inside the dielectric liner 114. The dielectric liners 114 may be primarily silicon dioxide-based dielectric material. The field plates 116 may be doped polysilicon.

A p-type body 120 of the MOS transistor 104 is located in the substrate 102 extending to the top surface 112. The body 120 of the MOS transistor 104 has at least one portion for each section of the vertical drift region 108. In the instant example, a first portion of the body (120A) of the MOS transistor 104 is located over one side of the first section of the vertical drift region (108A) and abuts the first RESURF trench (110A), and a second portion of the body (120B) of the MOS transistor 104 is located over one side of the second section of the vertical drift region (108B) and abuts the second RESURF trench (110B). The body 120 of the MOS transistor 104 may have an average doping density of $1\times10^{17}$ $cm^{-3}$ to $2\times10^{18}$ $cm^{-3}$.

A p-type body 122 of the channel diode 106 is located in the substrate 102. The body 122 of the channel diode 106 may have more than one portion; each portion of the body 122 of the channel diode 106 is located over one side of a section of the vertical drift region 108 opposite from a portion of the body 120 of the MOS transistor 104. Each portion of the body 122 of the channel diode 106 abuts one of the RESURF trenches 110. In the instant example, a first portion of the body (122A) of the channel diode 106 is located over one side of the first section of the vertical drift region (108A), opposite from the first portion of the body (120A) of the MOS transistor 104, and abuts the second RESURF trench (110B), and a second portion of the body (122B) of the channel diode 106 is located over one side of the second section of the vertical drift region (108B), opposite from the second portion of the body (120B) of the MOS transistor 104, and abuts the third RESURF trench (110C). The body 122 of the channel diode 106 may have an average doping density which is 20 percent to 33 percent of the average doping density of the body 120 of the MOS transistor 104. The first portion of the body (122A) of the channel diode 106 is laterally separated from the first portion of the body (120A) of the MOS transistor 104, and the second portion of the body (122B) of the channel diode 106 is laterally separated from the second portion of the body (120B) of the MOS transistor 104, by a distance 124 of 300 nanometers to 800 nanometers.

An n-type source 126 of the MOS transistor 104 is located in the substrate 102 proximate to the top surface 112, abutting the body 120 of the MOS transistor 104. The MOS transistor 104 may include a heavily doped p-type body contact region 128 abutting the body 120 of the MOS transistor 104. Similarly, an n-type source 130 of the channel diode 106 is located in the substrate 102 proximate to the top surface 112, abutting the body 122 of the channel diode 106. The channel diode 106 may include a heavily doped p-type body contact region 132 abutting the body 122 of the channel diode 106.

The semiconductor device 100 includes a split gate 134 located above the vertical drift region 108, on a gate dielectric layer 136 over the top surface 112 of the substrate. In the instant example, a first portion 138 of the split gate 134 provides a gate of the MOS transistor 104. The first portion 138 of the split gate 134 is located over the body 120 and partially overlapping the source 126 of the MOS transistor 104, and extending 10 nanometers to 150 nanometers past the body 120 toward the body 122 of the channel diode 106. A second portion 140 of the split gate 134 provides a gate of the channel diode 106. The second portion 140 of the split gate 134 is located over the body 122 and partially overlapping the source 130 of the channel diode 106, and extending 100 nanometers to 300 nanometers past the body 122 toward the body 120 of the MOS transistor 104. There is a space of 300 nanometers to 700 nanometers between the first portion 138 and the second portion 140 of the split gate 134. The split gate 134 may include polycrystalline silicon, referred to as polysilicon, and may have a layer of metal silicide over the polysilicon. A cap layer 142 may be disposed over the split gate 134. A conformal dielectric layer 144 may be disposed on sides of the split gate 134 and over the top surface 112 of the substrate 102. The cap layer 142 and the conformal dielectric layer 144 may be primarily silicon dioxide-based dielectric material.

An n-type lightly doped drain extension 146 is disposed in the substrate 102 proximate to the top surface 112 under the space between the first portion 138 and the second portion 140 of the split gate 134, between the body 120 of the MOS transistor 104 and the body 122 of the channel diode 106. The lightly doped drain extension 146 may have an average doping density of $2\times10^{16}$ $cm^{-3}$ to $1\times10^{17}$ $cm^{-3}$. An optional n-type punch-through blocking region 148 may be disposed in the substrate 102 under the lightly doped drain extension 146 between the body 120 of the MOS transistor 104 and the body 122 of the channel diode 106. The punch-through blocking region 148 may have an average doping density of $1\times10^{17}$ $cm^{-3}$ to $2\times10^{17}$ $cm^{-3}$.

A source electrode 150 is disposed over the top surface 112 of the substrate 102 and over the split gate 134, making electric connection to the source 126 and body contact region 128 of the MOS transistor 104, and to the source 130 and body contact region 132 of the channel diode 106. The source electrode 150 may optionally make electrical connection to the second portion 140 of the split gate 134 which provides the gate of the channel diode 106, for example where the cap layer 142 has been partially removed as depicted in FIG. 1. The source electrode 150 may optionally make electrical connection to the field plates 116 in the RESURF trenches 110 as shown in FIG. 1. The source electrode 150 may include a contact metal liner of titanium and titanium nitride and a layer of aluminum 1 micron to 5 microns thick on the contact metal liner.

An n-type drain contact region 152 is located in the substrate 102 below the vertical drift region 108. The drain contact region 152 may have a doping density of $1\times10^{18}$ $cm^{-3}$ to $1\times10^{21}$ $cm^{-3}$.

During operation of the semiconductor device 100, charge may be accumulated in the vertical drift region 108 while the MOS transistor 104 is turned on. When the MOS transistor 104 is turned off, the accumulated charge in the vertical drift region 108 may be discharged to the source electrode 150 through the channel diode 106, which may advantageously enable higher speed operation of the semiconductor device 100 compared to a semiconductor device with no channel diode. Integrating the channel diode 106 into the substrate 102 above the vertical drift region 108 may advantageously decrease the time required to discharge the accumulated charge in the vertical drift region 108 compared to an external channel diode.

Figure 2A:
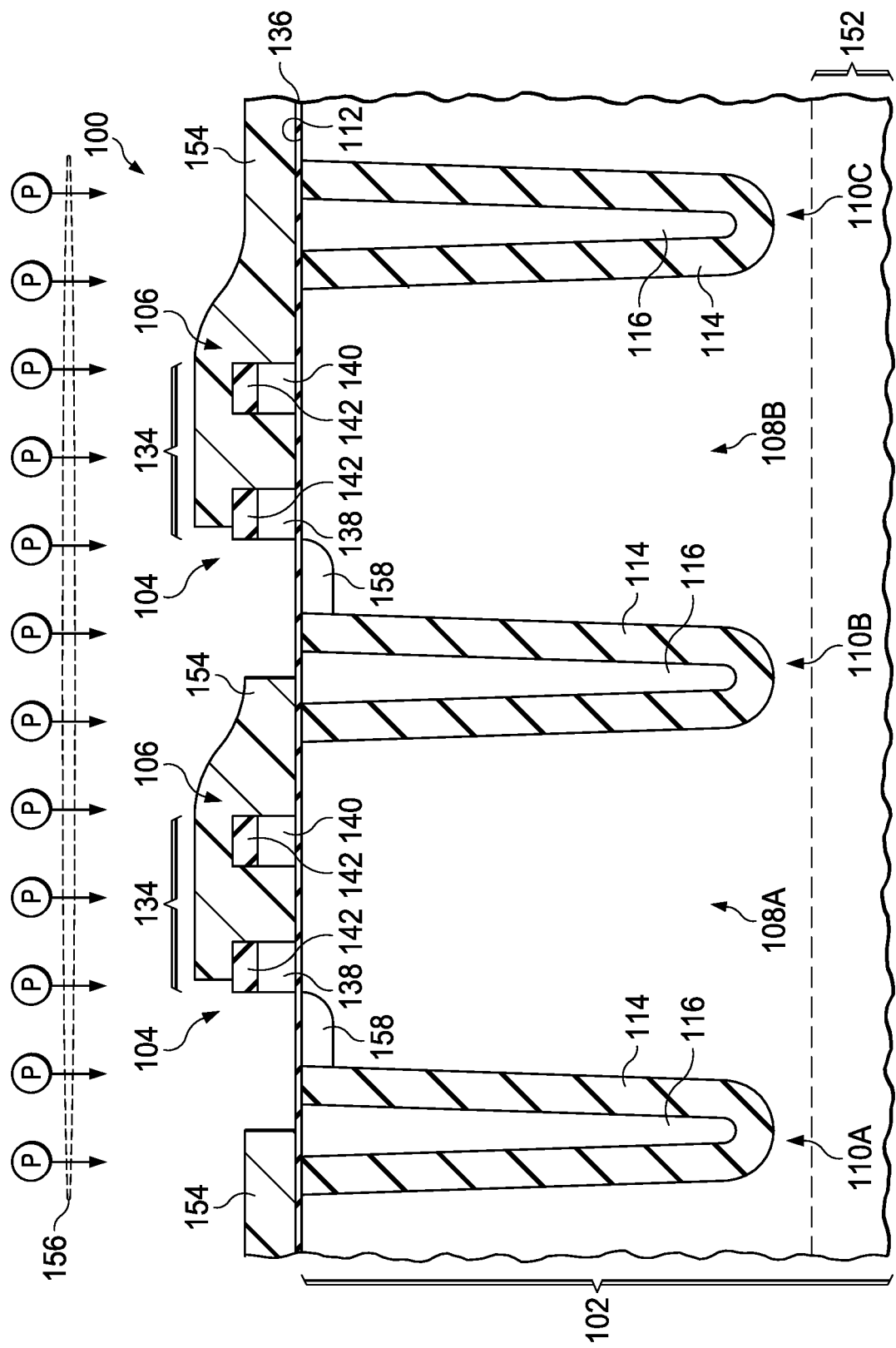
FIG. 2A through FIG. 2F are cross sections of the semiconductor device of FIG. 1, depicted in successive stages of fabrication.

FIG. 2A through FIG. 2F are cross sections of the semiconductor device of FIG. 1, depicted in successive stages of fabrication. Referring to FIG. 2A, the drain contact region 152 is formed in the substrate 102. The drain contact region 152 may be a buried layer and a portion of the substrate 102 over the drain contact region 152 containing the vertical drift region 108 may be formed by an epitaxial process. The RESURF trenches 110 are formed in the substrate 102 abutting the vertical drift region 108. The gate dielectric layer 136 is formed over the top surface 112 of the substrate, possibly extending over the dielectric liners 114 and field plates 116 of the RESURF trenches 110. The split gate 134 is formed on the gate dielectric layer 136 so that the first portion 138 of the split gate 134 over the first section of the vertical drift region (108A) is laterally separated from the first RESURF trench (110A) to allow space for the subsequently-formed body 120 of the MOS transistor 104, and so that the second portion 140 of the split gate 134 over the first section of the vertical drift region (108A) is laterally separated from the second RESURF trench (110B) to allow space for the subsequently-formed body 122 of the channel diode 106. The split gate 134 is formed over the second section of the vertical drift region (108B) with a similar configuration. The cap layer 142 may be formed over the split gate 134.

A first body implant mask 154 is formed over an existing top surface of the semiconductor device 100 so as to expose the substrate 102 between the first portions 138 of the split gate 134 and the adjacent RESURF trenches 110 over areas for the body 120 of the MOS transistor 104 of FIG. 1, and to cover the substrate 102 between the first portions 138 and the second portions 140 of the split gate 134 and to cover the substrate 102 between the second portions 140 and the adjacent RESURF trenches 110 over areas for the body 122 of the channel diode 106 of FIG. 1. The first body implant mask 154 may include photoresist formed by a photolithographic process. P-type dopants 156 such as boron are implanted at a dose of $3\times10^{13}$ $cm^{-2}$ to $3\times10^{14}$ $cm^{-2}$ into the substrate 102 exposed by the first body implant mask 154 to form a first body implanted region 158 between the first portions 138 of the split gate 134 and the adjacent RESURF trenches 110. The first body implant mask 154 is subsequently removed, for example by an ash process followed by a wet clean process.

Figure 2B:
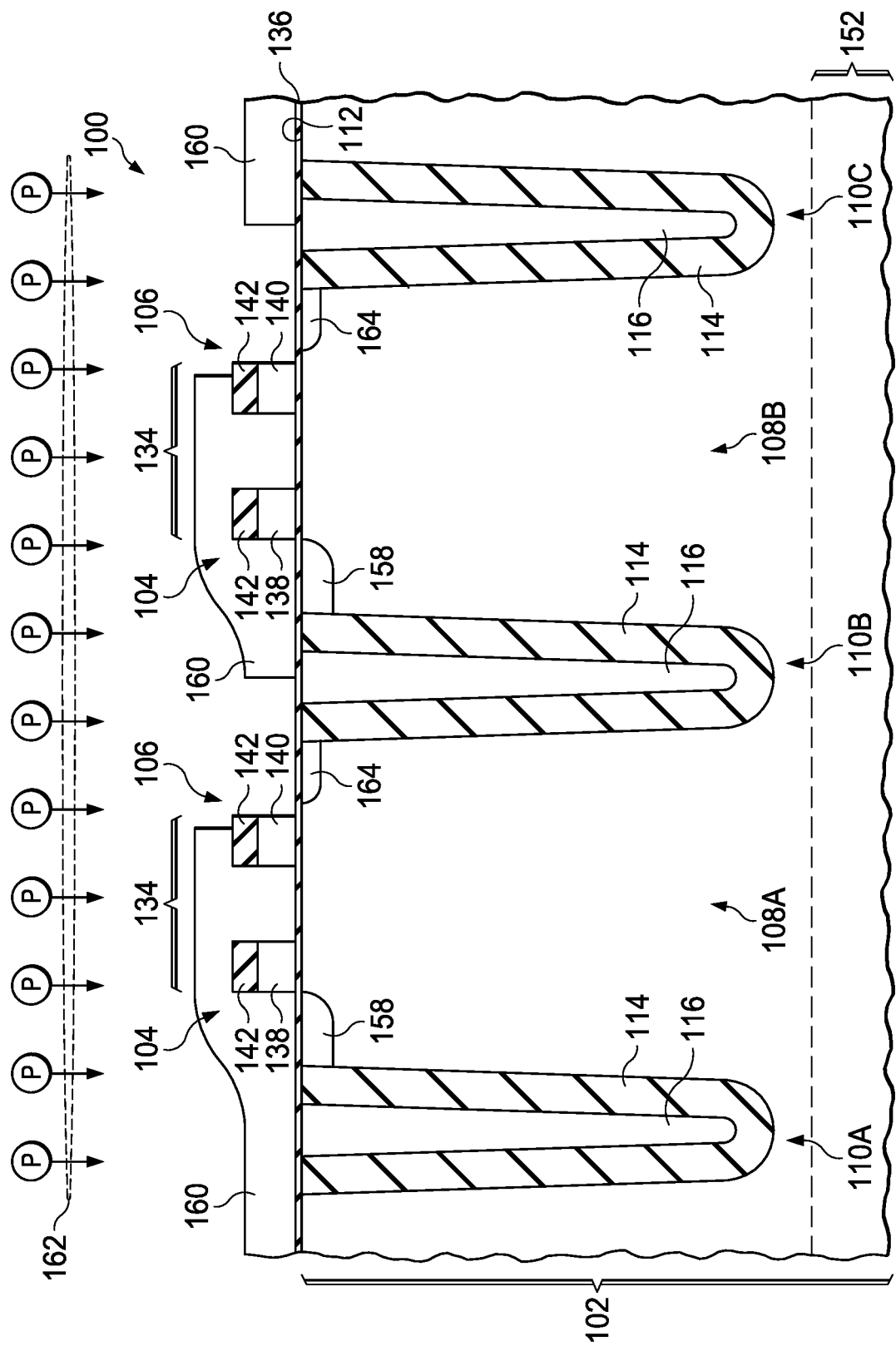

Referring to FIG. 2B, a second body implant mask 160 is formed over an existing top surface of the semiconductor device 100 so as to expose the substrate 102 between the second portions 140 of the split gate 134 and the adjacent RESURF trenches 110 over the areas for the body 122 of the channel diode 106 of FIG. 1, and to cover the substrate 102 between the first portions 138 and the second portions 140 of the split gate 134 and to cover the substrate 102 between the first portions 138 and the adjacent RESURF trenches 110 over the areas for the body 120 of the MOS transistor 104 of FIG. 1. The second body implant mask 160 may include photoresist formed by a photolithographic process. P-type dopants 162 such as boron are implanted into the substrate 102 exposed by the second body implant mask 160 to form a second body implanted region 164 between the second portions 140 of the split gate 134 and the adjacent RESURF trenches 110. A dose of the p-type dopants 162 may be 20 percent to 33 percent of the dose of the p-type dopants 156 of FIG. 2A implanted to form the first body implanted region 158. The second body implant mask 160 is subsequently removed, for example by an ash process followed by a wet clean process. Implanting the p-type dopants 162 for the body 122 of the channel diode 106 separately from implanting the p-type dopants 156 for the body 120 of the MOS transistor 104 may advantageously provide a desired level of dopant uniformity and dopant amount in both the body 122 of the channel diode 106 and the body 120 of the MOS transistor 104.

Figure 2C:
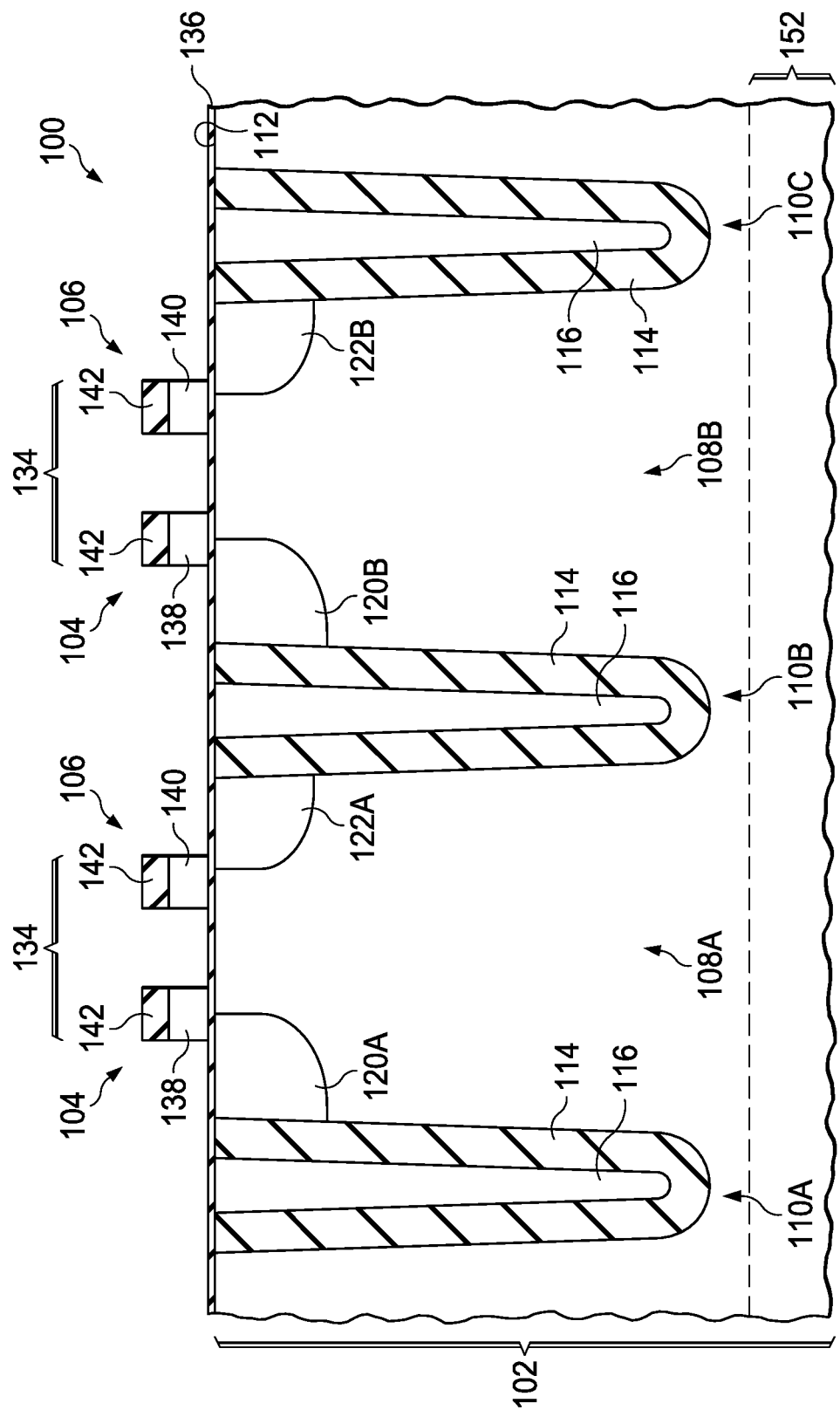

Referring to FIG. 2C, a thermal drive process diffuses and activates the p-type dopants in the first body implanted region 158 and the second body implanted region 164 of FIG. 2B to form the body 120 of the MOS transistor 104 extending partway under the first portions 138 of the split gate 134 and abutting the adjacent RESURF trenches 110, and to form the body 122 of the channel diode 106 extending partway under the second portions 140 of the split gate 134, and abutting the adjacent RESURF trenches 110. The body 122 of the channel diode 106 may not extend as far under the second portions 140 of the split gate 134 as the body 120 of the MOS transistor 104 extends under the first portions 138, due to the lower dose of the p-type dopants used to form the body 122 of the channel diode 106. The thermal drive process may include heating the substrate 102 at 1100° C. for 90 minutes or equivalent conditions, for example, 1125° C. for 50 minutes, or 1050° C. for 270 minutes.

Figure 2D:
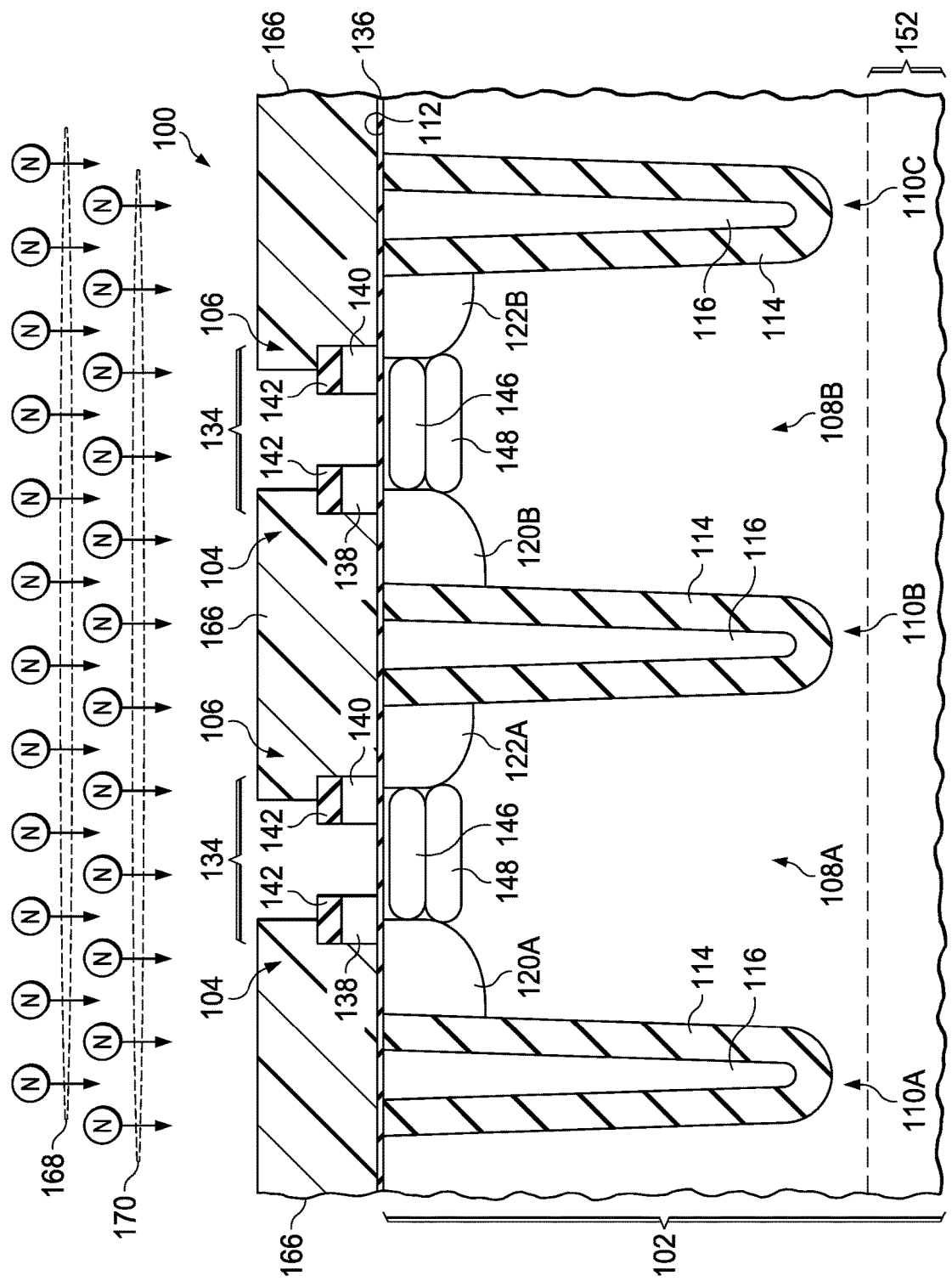

Referring to FIG. 2D, a drain extension mask 166 is formed over an existing top surface of the semiconductor device 100 so as to expose the substrate 102 in the spaces between the first portions 138 and the second portions 140 of the split gate 134 and to cover the body 120 of the MOS transistor 104 and the body 122 of the channel diode 106. The drain extension mask 166 may include photoresist formed by a photolithographic operation. N-type dopants 168 such as phosphorus and arsenic are implanted into the substrate 102 exposed by the drain extension mask 166 to form implanted regions for the lightly doped drain extension 146. A dose of the n-type dopants 168 may be at a dose of $7\times10^{11}$ $cm^{-2}$ to $2\times10^{12}$ $cm^{-2}$ and an energy of 100 keV to 200 keV. Additional n-type dopants 170 may optionally be implanted while the drain extension mask 166 is in place to form implanted regions for the punch-through blocking region 148. The additional n-type dopants 170 may be implanted at a dose of $2 \times 10^{12}$ cm$^{-2}$ to $5 \times 10^{12}$ cm$^{-2}$ and an energy of 200 keV to 350 keV. The drain extension mask 166 is subsequently removed, and the substrate 102 is annealed, for example by a rapid thermal anneal process, to form the lightly doped drain extension 146 and the punch-through blocking region 148. The lightly doped drain extension 146 extends partway under the first portion 138 of the split gate 134, proximate to, or abutting, the body 120 of the MOS transistor 104, and extends partway under the second portion 140 of the split gate 134, proximate to, or abutting, the body 122 of the channel diode 106. In an alternate version of the instant example, the drain extension mask 166 may expose a portion or all of the body 120 of the MOS transistor 104.

Figure 2E:
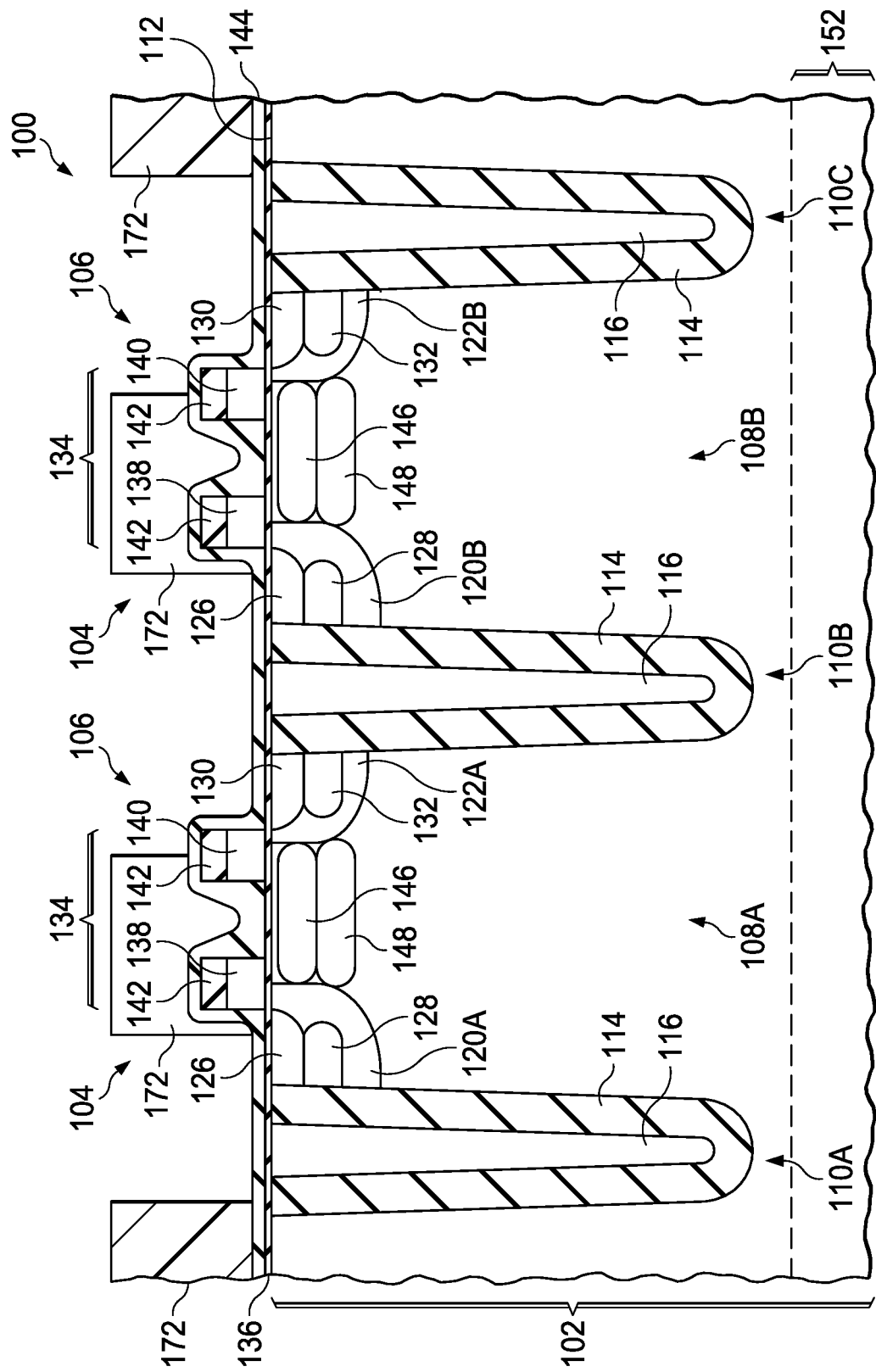

Referring to FIG. 2E, the conformal dielectric layer 144 is formed over the split gate 134 and the top surface 112 of the substrate 102. The conformal dielectric layer 144 may be 50 nanometers to 100 nanometers thick, formed by a plasma enhanced chemical vapor deposition (PECVD) process using tetraethyl orthosilicate, also known as tetraethoxysilane (TEOS), or a low pressure chemical vapor deposition (LPCVD) process using dichlorosilane.

The source 126 of the MOS transistor 104 and the source 130 of the channel diode 106 are formed concurrently by implanting n-type dopants such as phosphorus and arsenic at a dose of $8 \times 10^{14}$ cm$^{-2}$ to $1 \times 10^{16}$ cm$^{-2}$ and an energy of 20 keV to 70 keV, using an implant mask, not shown, which exposes the substrate 102 between the first portion 138 of the split gate 134 and the adjacent RESURF trench 110 and between the second portion 140 and the adjacent RESURF trench 110. P-type dopants such as boron may be implanted at a dose of $5 \times 10^{13}$ cm$^{-2}$ to $1 \times 10^{15}$ cm$^{-2}$ and an energy of 30 keV to 100 keV while the implant mask is in place to concurrently form the body contact region 128 of the MOS transistor 104 and the body contact region 132 of the channel diode 106. The implant mask is removed after the implant processes are completed, and the substrate is annealed, for example by a rapid thermal anneal process, to activate the implanted dopants.

A contact etch mask 172 is formed over an existing top surface of the semiconductor device 100 so as to expose the source 126 of the MOS transistor 104 and the source 130 of the channel diode 106, and expose the field plates 116. The contact etch mask covers the first portion 138 of the split gate 134 and the space between the first portion 138 and the second portion 140 of the split gate 134. The contact etch mask 172 may optionally partially expose the second portion 140 of the split gate 134 as depicted in FIG. 2E. The contact etch mask 172 may include photoresist and/or hard mask material.

Figure 2F:
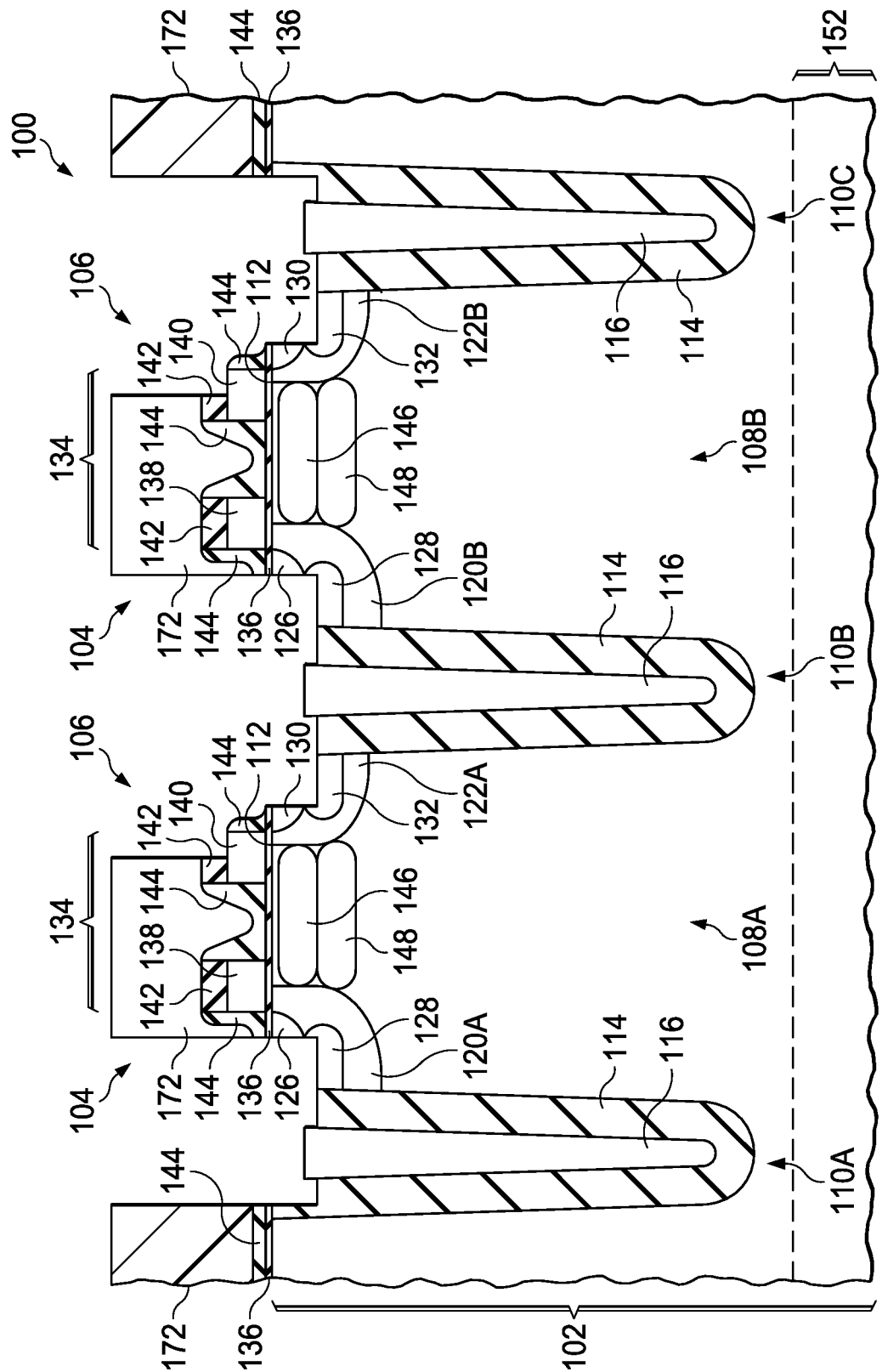

Referring to FIG. 2F, a contact etch process removes material from the conformal dielectric layer 144, the substrate 102, the dielectric liners 114 and the field plates 116 in the areas exposed by the contact etch mask 172, so as to provide contact surfaces at the source 126 and body contact region 128 of the MOS transistor 104 and the source 130 and body contact region 132 of the channel diode 106, and the field plates 116. The contact etch process may optionally remove a portion of the cap layer 142 on the second portion 140 of the split gate 134 to provide a contact surface on the second portion 140, as depicted in FIG. 2F. After the contact etch process is completed, the contact etch mask 172 is removed, for example by an ash process followed by a wet clean process.

After the contact etch mask 172 is removed, the contact surfaces on the source 126 and body contact region 128 of the MOS transistor 104 and the source 130 and body contact region 132 of the channel diode 106, and the field plates 116 may be prepared for contact metal, for example by a sputter etch process. Fabrication of the semiconductor device 100 is continued by forming the source electrode 150 of FIG. 1.

Figure 3:
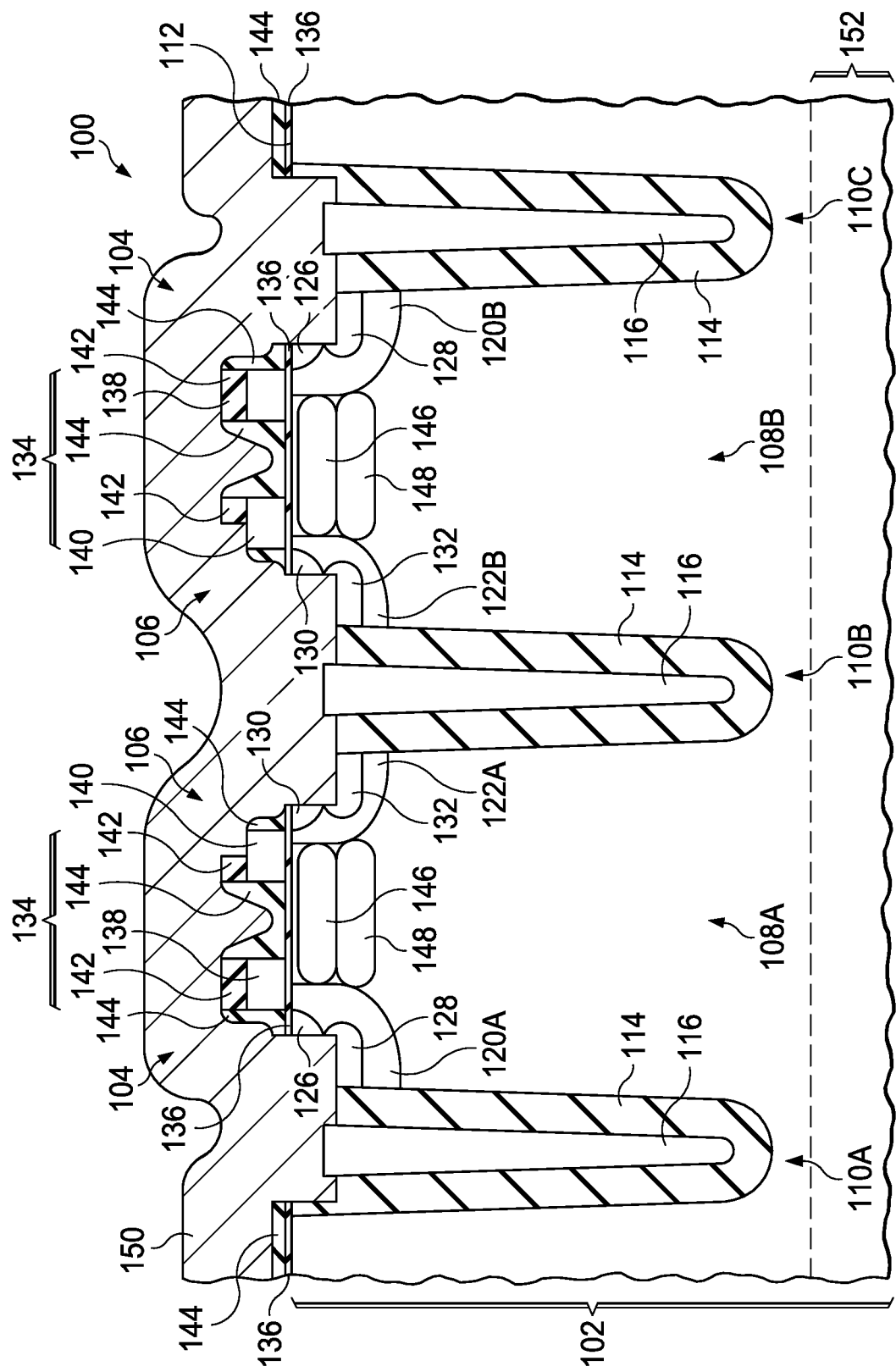
FIG. 3 is a cross section of another version of the semiconductor device of FIG. 1 in which the integrated channel diode has a back-to-back configuration.

FIG. 3 is a cross section of another version of the semiconductor device of FIG. 1 in which the integrated channel diode has a back-to-back configuration. The first portion of the body (120A) of the MOS transistor 104 is located above the first section of the vertical drift region (108A) and abuts the first RESURF trench (110A), and the first portion of the body (122A) of the channel diode 106 is located above the first section of the vertical drift region (108A) and abuts the second RESURF trench (110B), similar to the configuration of FIG. 1. In the instant example, the second portion of the body (120B) of the MOS transistor 104 is located over the second section of the vertical drift region (108B) and abuts the third RESURF trench (110C), and the second portion of the body (122B) of the channel diode 106 is located over the second section of the vertical drift region (108B) and abuts the second RESURF trench (110B), so that the portions of the channel diode 106 are located on opposite sides of the second RESURF trench (110B). The semiconductor device 100 may contain additional sections of the vertical drift region 108, and adjacent portions of the MOS transistor 104 may be located on opposite sides of a RESURF trench 110 in a back-to-back configuration. Forming the channel diode 106 with a back-to-back configuration may advantageously relax photolithographic constraints on the first and second body implant masks discussed in reference to FIG. 2A and FIG. 2B, thus reducing a fabrication cost and complexity of the semiconductor device 100.

Figure 4:
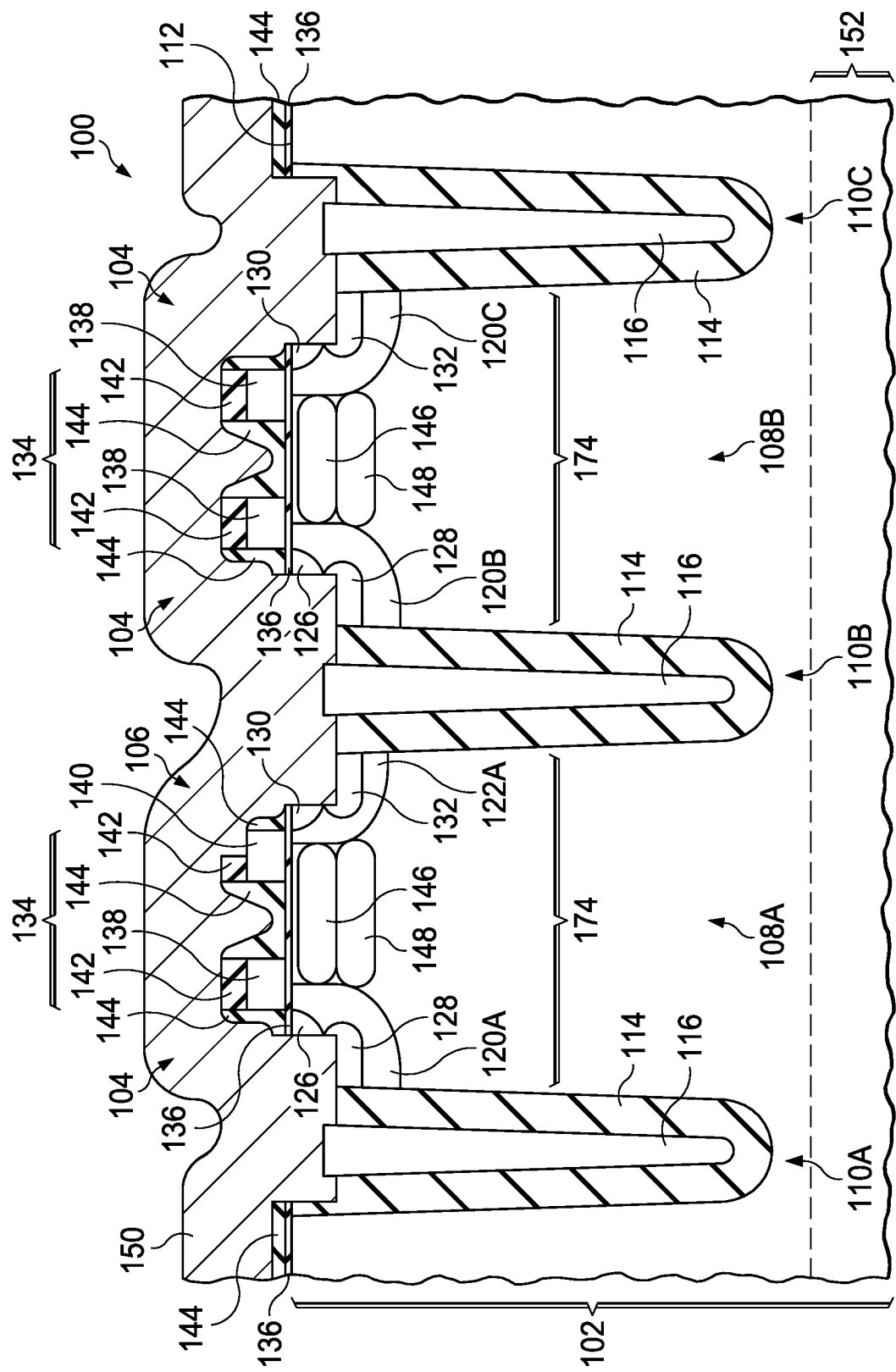
FIG. 4 is a cross section of an alternate version of the semiconductor device of FIG. 1 in which one section of the vertical drift region does not have the integrated channel diode.

FIG. 4 is a cross section of an alternate version of the semiconductor device of FIG. 1 in which one section of the vertical drift region does not have the integrated channel diode. The first portion of the body (120A) of the MOS transistor 104 is located above the first section of the vertical drift region (108A) and abuts the first RESURF trench (110A), and the first portion of the body (122A) of the channel diode 106 is located above the first section of the vertical drift region (108A) and abuts the second RESURF trench (110B), similar to the configuration of FIG. 1. In the instant example, the second portion of the body (120B) of the MOS transistor 104 is located over the second section of the vertical drift region (108B) and abuts the third RESURF trench (110C), and a third portion of the body (120C) of the MOS transistor 104 is located over the second section of the vertical drift region (108B) and abuts the second RESURF trench (110B). The semiconductor device 100 may contain additional sections of the vertical drift region 108, some sections of the vertical drift region 108 with a portion of the MOS transistor 104 and a portion of the channel diode 106, and some sections of the vertical drift region 108 with two portions of the MOS transistor 104 and free of a portion of the channel diode 106. The relative proportion of the channel diode 106 to the MOS transistor 104 may be selected to provide a desired resistance and operating frequency for the semiconductor device 100 while advantageously minimizing a size of the semiconductor device 100.

Figure 5A:
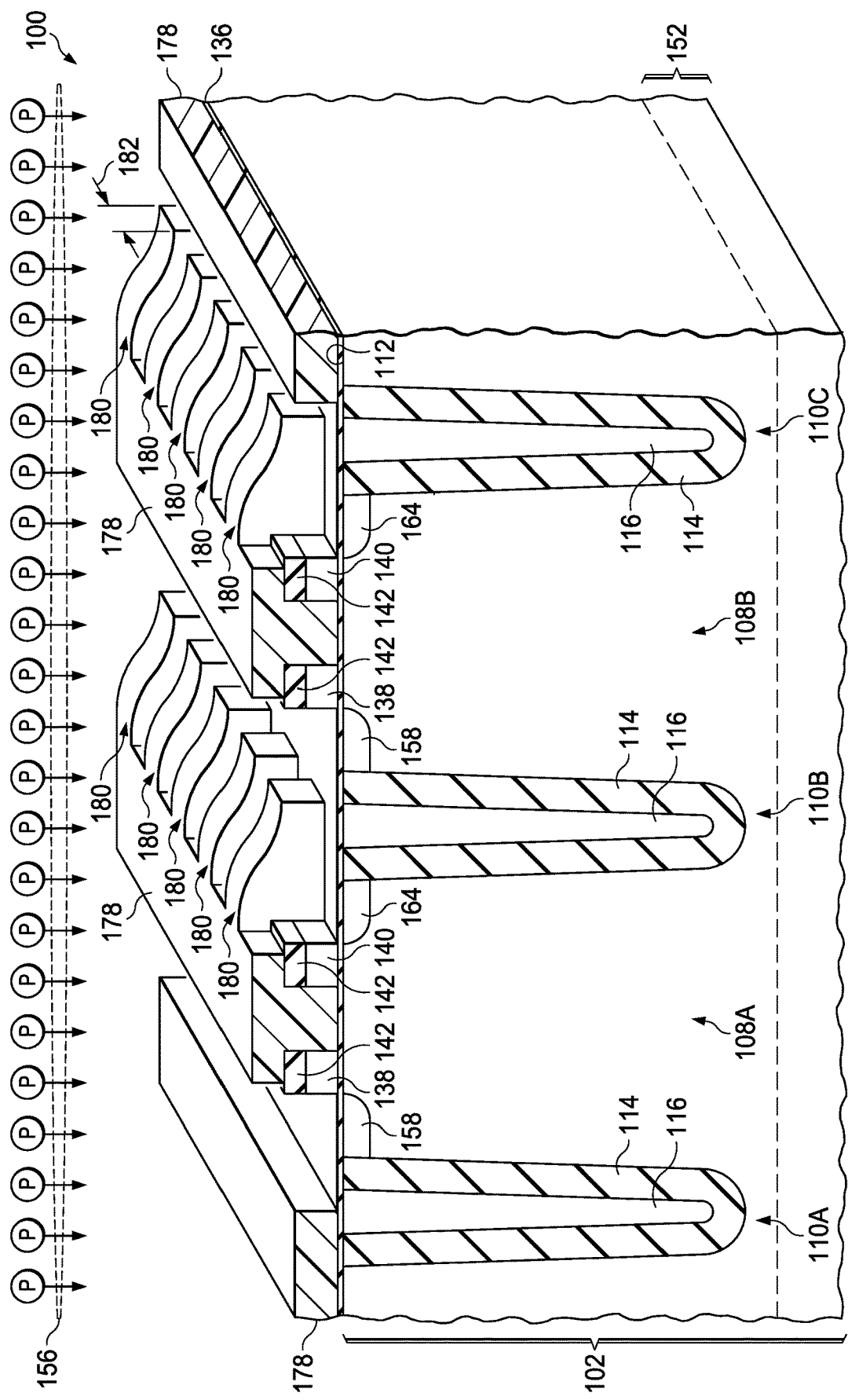
FIG. 5A and FIG. 5B are cross sections of the semiconductor device of FIG. 1, depicting an alternate method of forming the body of the MOS transistor and the body of the channel diode.
Figure 5B:
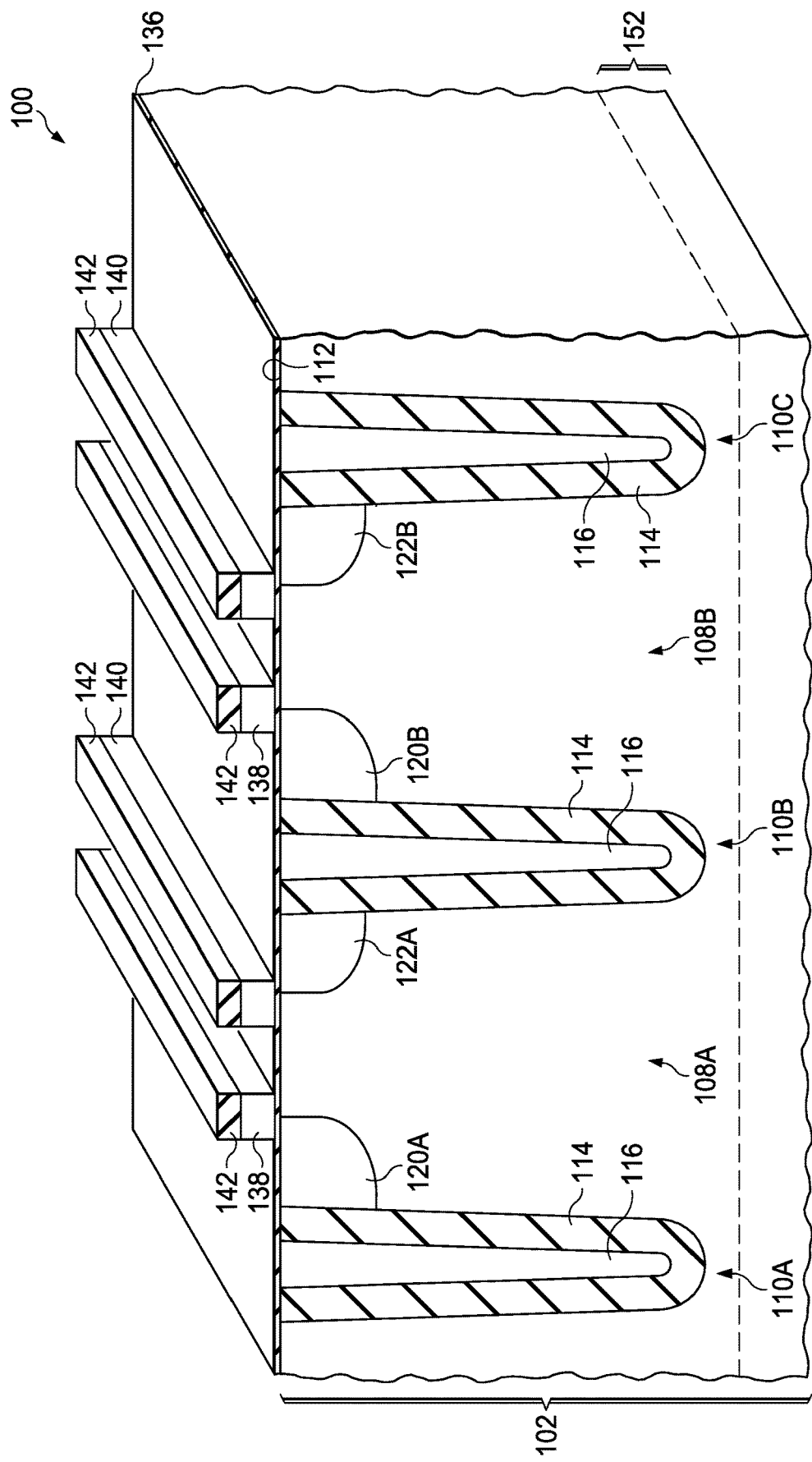

FIG. 5A and FIG. 5B are cross sections of the semiconductor device of FIG. 1, depicting an alternate method of forming the body of the MOS transistor and the body of the channel diode. Referring to FIG. 5A, a combined body implant mask 178 is formed over an existing top surface of the semiconductor device 100. The combined body implant mask 178 exposes substantially 100 percent of the area for the first body implanted region 158 between the first portion 138 of the split gate 134 and the RESURF trench 110 adjacent to the first portion 138. The combined body implant mask 178 has fingers 180 over a portion of the area for the second body implanted region 164 between the second portion 140 of the split gate 134 and the RESURF trench 110 adjacent to the second portion 140, so that the combined body implant mask 178 exposes substantially 20 percent to 33 percent of the area for the second body implanted region 164. A width 182 of the fingers 180 may be 0.5 microns to 1 micron. The combined body implant mask 178 covers the space between the first portion 138 and the second portion 140 of the split gate 134.

P-type dopants 156 such as boron are implanted at a dose of $3 \times 10^{13}$ cm$^{-2}$ to $2 \times 10^{14}$ cm$^{-2}$ into the substrate 102 exposed by the combined body implant mask 178 to concurrently form the first body implanted region 158 and the second body implanted region 164. The second body implanted region 164 may be separated into a plurality of implanted regions due to the fingers 180 of the combined body implant mask 178. A total dose of the p-type dopants 156 in the second body implanted region 164 is substantially 20 percent to 33 percent of a total dose of the p-type dopants 156 in the first body implanted region 158; the percentage is determined by the fingers 180 of the combined body implant mask 178. The combined body implant mask 178 is removed after the p-type dopants 156 are implanted. Forming the second body implanted region 164 concurrently with the first body implanted region 158 using the combined body implant mask 178 may advantageously reduce the fabrication cost of the semiconductor device 100 compared to forming the body implanted regions 158 and 164 separately.

Referring to FIG. 5B, the thermal drive process diffuses and activates the p-type dopants in the first body implanted region 158 and the second body implanted region 164 of FIG. 5A to form the body 120 of the MOS transistor 104 extending partway under the first portion 138 of the split gate 134 and abutting the RESURF trench 110 adjacent to the first portion 138, and to form the body 122 of the channel diode 106 extending partway under the second portion 140 of the split gate 134, and abutting the RESURF trench 110 adjacent to the second portion 140. The dopants in the second body implanted region 164 diffuse together, so that the body 122 of the channel diode 106 is contiguous and acceptably uniform. The average doping density in the body 122 of the channel diode 106 relative to the average doping density in the body 120 of the MOS transistor 104 is determined by the fingers 180 of the combined body implant mask 178.

Figure 6A:
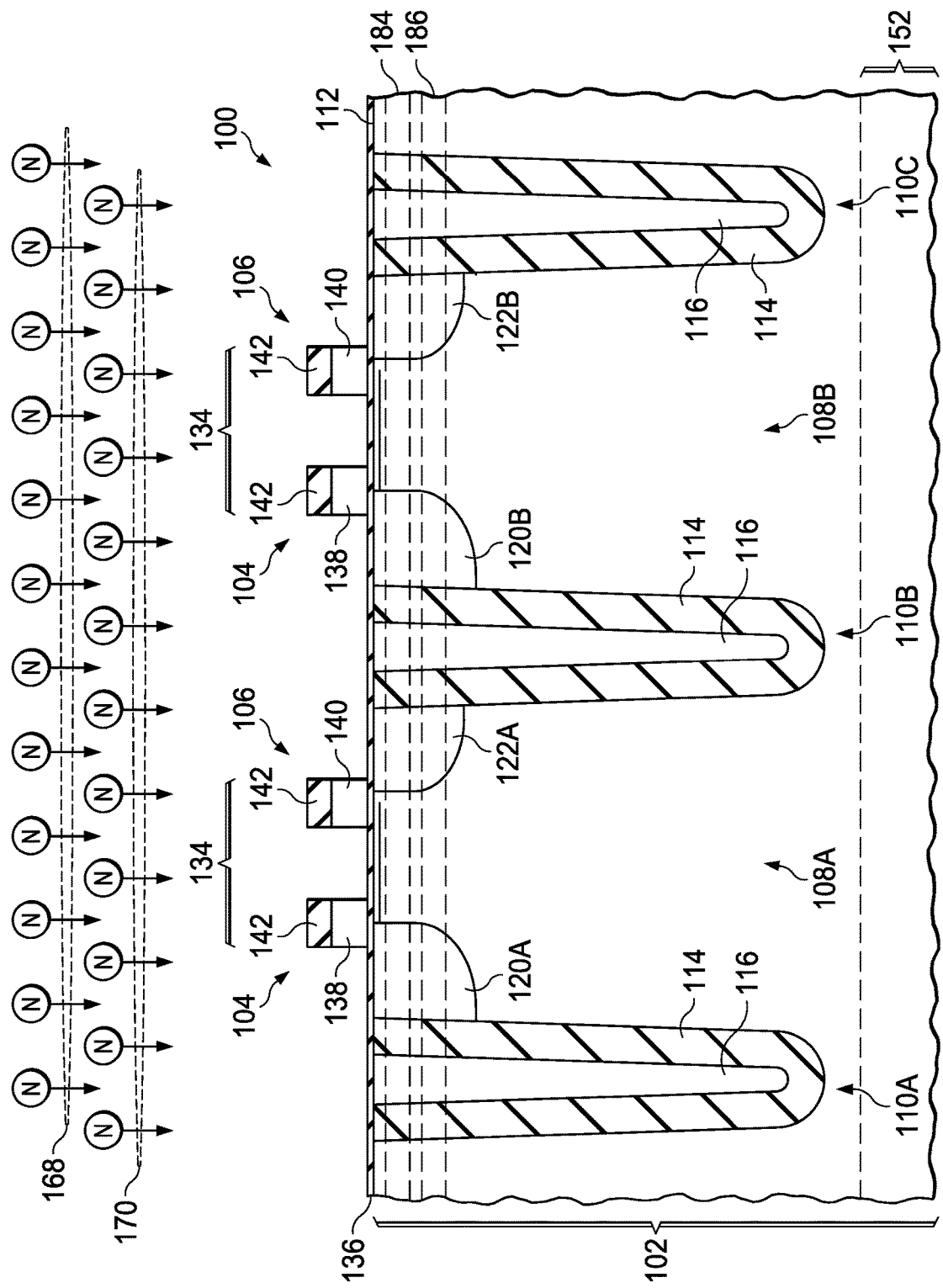
FIG. 6A and FIG. 6B are cross sections of the semiconductor device of FIG. 1, depicting an alternate method of forming the lightly doped drain extension and the punch-through blocking region.
Figure 6B:
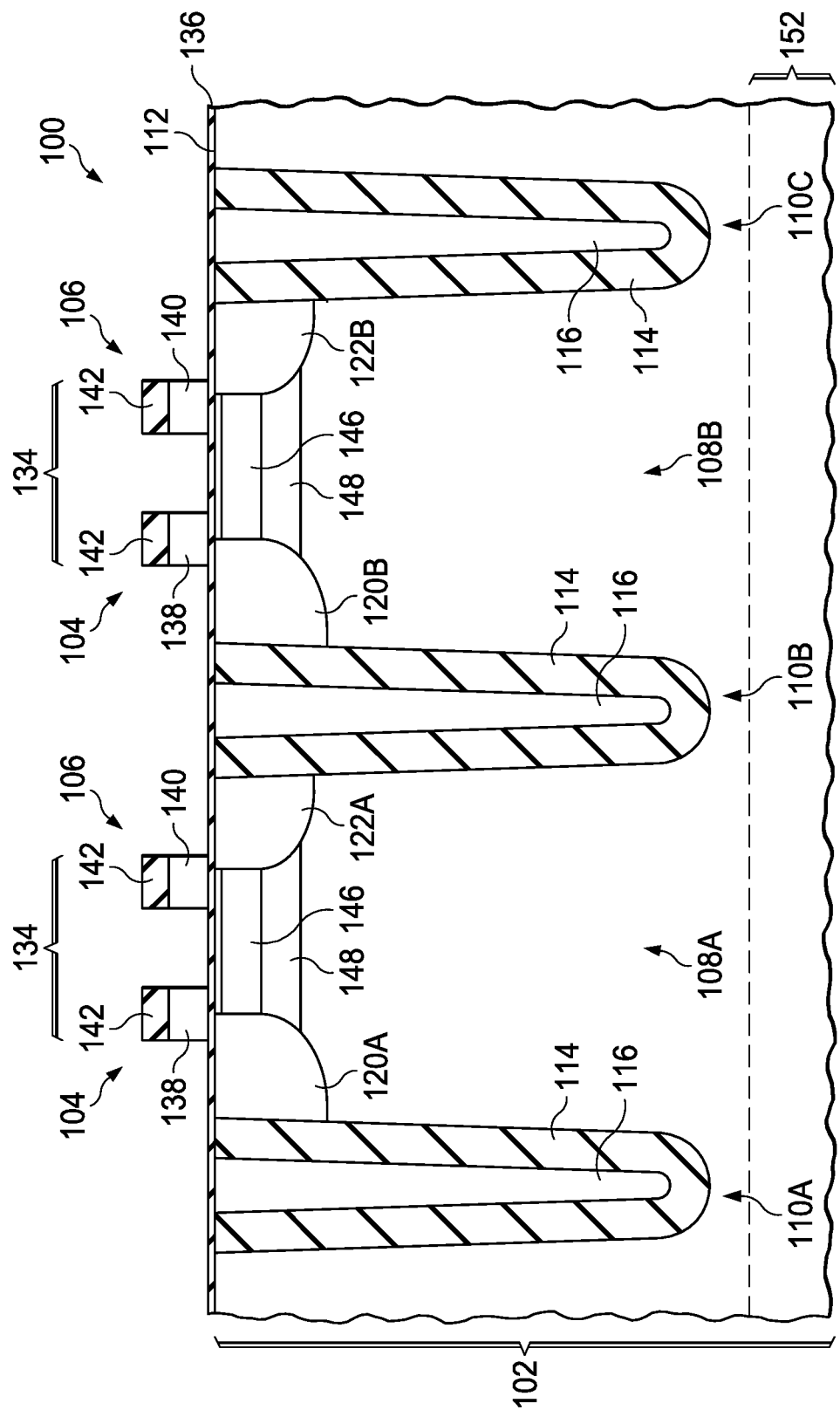

FIG. 6A and FIG. 6B are cross sections of the semiconductor device of FIG. 1, depicting an alternate method of forming the lightly doped drain extension and the punch-through blocking region. Referring to FIG. 6A, the semiconductor device is free of an implant mask over the MOS transistor 104 and the channel diode 106. N-type dopants 168 such as phosphorus and arsenic are implanted into the substrate 102 to form a drain extension implanted region 184 which extends across the MOS transistor 104 and the channel diode 106. A dose of the n-type dopants 168 may be at a dose of $7 \times 10^{11}$ cm$^{-2}$ to $2 \times 10^{12}$ cm$^{-2}$ and an energy of 100 keV to 200 keV. Additional n-type dopants 170 may optionally be implanted to form a punch-through implanted region 186 which also extends across the MOS transistor 104 and the channel diode 106. The additional n-type dopants 170 may be implanted at a dose of $2 \times 10^{12}$ cm$^{-2}$ to $5 \times 10^{12}$ cm$^{-2}$ and an energy of 200 keV to 350 keV. Doses of the n-type dopants 168 and the additional n-type dopants 170 are sufficiently low to avoid converting the body 122 of the channel diode 106 to n-type. Forming the drain extension implanted region 184 and the punch-through implanted region 186 without forming an implant mask may advantageously reduce the fabrication cost and complexity of the semiconductor device 100.

Referring to FIG. 6B, an anneal operation such as a rapid thermal anneal process activates the implanted dopants in the drain extension implanted region 184 and the punch-through implanted region 186 of FIG. 6A to form the lightly doped drain extension 146 and the punch-through blocking region 148. The lightly doped drain extension 146 and the punch-through blocking region 148 extend from the body 120 of the MOS transistor 104 to the body 122 of the channel diode 106.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A semiconductor device, comprising:
  a substrate having a first surface and a second surface opposite the first surface;
  a drain contact region adjacent to the second surface;
  a trench structure penetrating the substrate from the first surface without reaching the drain contact region, the trench structure having a first side, a second side opposite the first side, and a conductive plate;
  a diode structure abutting the first side of the trench structure, the diode structure having a diode gate electrically coupled to the conductive plate and located directly on a gate dielectric; and a
  transistor structure abutting the second side of the trench structure, the transistor structure having a transistor gate insulated from the conductive plate.

2. The semiconductor device of claim 1, further comprising:
  an electrode layer above the first surface, the electrode layer electrically connecting the diode gate and the conductive plate.

3. The semiconductor device of claim 2, further comprising:
  a first insulation cap insulating the transistor gate from the electrode layer; and
  a second insulation cap partially exposing the diode gate to the electrode layer.

4. The semiconductor device of claim 2, wherein the electrode layer is located between the diode gate and the transistor gate.

5. The semiconductor device of claim 3, wherein:
  the diode gate has a first top surface and a second top surface farther away from the trench structure than the first top surface; and
  the second insulation cap exposes the first top surface to the electrode layer and covers the second top surface from the electrode layer.

6. The semiconductor device of claim 1, wherein the diode structure includes:
  a body region abutting the first side of the trench structure; and a source region within the body region and under the diode gate, the source region capacitively coupled to the diode gate and conductively connected to the conductive plate.

7. The semiconductor device of claim 1, wherein the transistor structure includes:
   a body region abutting the second side of the trench structure; and
   a source region within the body region and under the transistor gate, the source region conductively connected to the conductive plate and insulated from the transistor gate.

8. The semiconductor device of claim 1, wherein the trench structure includes a dielectric liner insulating the conductive plate from the substrate.

9. An integrated circuit, comprising:
   a trench structure extending from a top surface of a semiconductor substrate into the substrate, the trench structure having a conductive plate and a dielectric liner between the semiconductor substrate and the conductive plate;
   a diode having a diode gate and a first p-type region abutting a first side of the dielectric liner, the diode (late located directly on a (late dielectric;
   a transistor having a transistor gate and a second p-type region abutting a second side of the dielectric liner; and
   an electrode layer overlying the diode gate, the transistor gate and the conductive plate, the diode gate electrically conductively coupled to the conductive plate by the metal layer, and the transistor gate of being insulated from the electrode layer.

10. The integrated circuit of claim 9, further comprising:
    a first insulation cap insulating the transistor gate from the electrode layer; and
    a second insulation cap partially exposing the diode gate to the electrode layer.

11. The integrated circuit of claim 10, wherein the electrode layer is connected to a portion of the diode gate located between the second insulation cap and the trench structure.

12. The integrated circuit of claim 9, further comprising a first n-type region located between the conductive plate and the first p-type region.

13. The integrated circuit of claim 9, further comprising a second n-type region located between the conductive plate and the second p-type region.

14. The integrated circuit of claim 9, wherein the electrode layer is located between the diode gate and the transistor gate.

15. The integrated circuit of claim 9, further comprising a heavily doped layer within the semiconductor substrate, wherein a portion of the substrate having a dopant concentration less than the heavily doped layer is located between the heavily doped layer and the trench structure.

\* \* \* \* \*